US008354355B2

(12) United States Patent
Finley

(10) Patent No.: US 8,354,355 B2
(45) Date of Patent: Jan. 15, 2013

(54) METHOD OF PRODUCING PARTICLES BY PHYSICAL VAPOR DEPOSITION IN AN IONIC LIQUID

(75) Inventor: James J. Finley, Pittsburgh, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 1177 days.

(21) Appl. No.: 11/654,252

(22) Filed: Jan. 17, 2007

(65) Prior Publication Data

US 2010/0267549 A1 Oct. 21, 2010

Related U.S. Application Data

(60) Provisional application No. 60/759,457, filed on Jan. 17, 2006.

(51) Int. Cl.
*C23C 14/34* (2006.01)

(52) U.S. Cl. ........ 502/100; 502/151; 427/480; 427/481; 427/486; 427/497; 252/182; 252/500

(58) Field of Classification Search .................. 502/100; 428/623, 432, 469; 250/423
See application file for complete search history.

(56) References Cited

U.S. PATENT DOCUMENTS

| | | | |
|---|---|---|---|
| 4,898,789 A | 2/1990 | Finley | 428/623 |
| 4,898,790 A * | 2/1990 | Finley | 428/623 |
| 6,444,256 B1 | 9/2002 | Musket et al. | 427/117 |
| 6,768,119 B2 * | 7/2004 | de la Mora et al. | 250/423 R |
| 2005/0191492 A1 | 9/2005 | Yadav | 428/407 |
| 2005/0248825 A1 * | 11/2005 | Warren et al. | 359/265 |

FOREIGN PATENT DOCUMENTS

| | | |
|---|---|---|
| JP | 2003 245540 | 2/2003 |
| JP | 2003-245540 | * 9/2003 |
| WO | 2006/132308 | 12/2006 |
| WO | 2007/105443 | 9/2007 |

OTHER PUBLICATIONS

A study on the electrodeposition of tantalum on NiTi alloy in an ionic liquid and corrosion behavior of the coated alloy. By Szein El Abedin et al. Aug. 2005. Electrochemistry Communications 7 (2005) 941-946.*
Preparation of ExtremelyFine particles by Vaccum Evaporation onto a running oil substrated. By S Yatsuya et al. 1978. Journal of Crystal Growth 45. 490-494.*
Preparation of Extremely Fine Particles by Vacuum Evaporation Onto a Running Oil Substrate, by S. Yatsuya et al. Journal of Crystal Growth 45 (1978) 490-494.*
Ionic Liquids: Innovative Fluids for Chemical Processing. By Joan F. Brenncke et al. AIChE Journal. 2001. vol. 47, No. 11.*
"Preparation of Extremely Fine Particles by Vacuum Evaporation Onto a Running Oil Substrate", by Yatsuya et al. (1978) Journal of Crystal growth-490-494).*
"Ionic Liquids: Innovative Fluids for Chemical Processing" by Brennecke et al. AIChE Journal. 2001, vol. 47, No. 11).*

(Continued)

*Primary Examiner* — Melvin C Mayes
*Assistant Examiner* — Colette Nguyen
(74) *Attorney, Agent, or Firm* — Andrew C. Siminerio

(57) ABSTRACT

A method is provided for producing particles, such as nanoparticles. The method includes introducing an ionic liquid into a deposition chamber, and directing one or more material toward or depositing one or more materials onto the ionic liquid by physical vapor deposition to form nanoparticles in the ionic liquid.

25 Claims, 16 Drawing Sheets

OTHER PUBLICATIONS

U.S. Appl. No. 60/759,457, filed Jan. 17, 2006.

International Search Report, PCT/US2007/001226 dated Oct. 25, 2007.

http://www.solvent-innovation.comlindex_overview.htm.

Freyland W. et al, "Nanoscale Electrodeposition of Metals and Semiconductors from Ionic Liquids", Electrochimica Acta, Elsevier Science Pub., Barking, GB, vol. 48, No. 20-22, pp. 3053-3061.

Zein El Abedin et al, "A Study on the Electrodeposition of Tantalum on NiTi Alloy in an Ionic Liquid and Corrosion Behaviour of the Coated Alloy", Electrochemistry Comm., Elsevier, Amsterdam, NL, vol. 7, No. 9, (Sep. 2005), pp. 941-946.

AIChE Journal, (Nov. 2001) vol. 47, pp. 2384-2389.

http://srdata.nist.gov/xps/index.htm.

S. Yatsuya et al, J. Cryst. Growth, 43, 490 (1978).

I. Nakatani et al, J. Magn. Magn. Mater., 122 (1993) 10.

\* cited by examiner

METHOD OF PRODUCING PARTICLES BY PHYSICAL VAPOR DEPOSITION IN AN IONIC LIQUID

CROSS-REFERENCE TO RELATED APPLICATION

This application claims priority to U.S. Provisional Application No. 60/759,457, filed Jan. 17, 2006, which provisional application is herein incorporated by reference in its entirety.

FIELD OF THE INVENTION

The present invention relates generally to the formation of particles and, in one particular non-limiting embodiment, to the formation of nanoparticles in an ionic liquid.

BACKGROUND

A nanoparticle is a microscopic particle whose size is measured in nanometers (nm). Nanoparticles made of semi-conducting material may also be called quantum dots if they are small enough (typically less than 10 nm) that quantization of electronic energy levels occurs.

Nanoparticles are of great scientific interest as they are effectively a bridge between bulk materials and atomic or molecular structures. A bulk material should have constant physical properties regardless of its size, but at the nano-scale this is often not the case. Size-dependent properties are observed such as quantum confinement in semiconductor particles, surface plasmon resonance in some metal particles and superparamagnetism in magnetic materials. Nanoparticle research is currently an area of intense scientific research, due to a wide variety of potential applications in biomedical, optical, and electronic fields.

Currently, nanoparticles are generally formed using solution chemical processes. For example, gold nanoparticles can be produced by the reduction of hydrogen tetrachloroaurate in the presence of a reducing agent. This causes the gold ions to reduce to un-ionized gold atoms, which precipitate in the form of sub-nanometer particles. To prevent the particles from aggregating, a stabilizing agent that sticks to the nanoparticle surface is usually added. The nanoparticles can be functionalized with various organic ligands to create organic-inorganic hybrids with advanced functionality.

While adequate for forming nanoparticles, these current solution chemical processes do have some drawbacks. For example, multiple heating and reacting steps may be required during the process. In addition, some of the reagents required may be harmful to workers and thus difficult or hazardous to work with. Moreover, when the nanoparticles are finally formed, they are typically separated and packaged such that the particles become agglomerated rather than remain as individual particles.

Therefore, it would be advantageous to provide a method of making nanoparticles that reduces or eliminates at least some of the problem associated with current methods.

SUMMARY OF THE INVENTION

A method is provided for producing particles. The method includes introducing an ionic liquid into a deposition chamber, and directing one or more materials toward the ionic liquid by physical vapor deposition to provide particles in the ionic liquid.

A method for producing nanoparticles includes introducing an ionic liquid into a deposition chamber; evacuating the deposition chamber to form a vacuum in the range of 1 and 7 microns of Hg; and sputtering one or more cathodes in the deposition chamber to direct one or more materials toward the ionic liquid to form nanoparticles in the ionic liquid.

A composition of the invention includes an ionic liquid and nanoparticles formed in the ionic liquid by physical vapor deposition.

BRIEF DESCRIPTION OF THE DRAWINGS

The invention will be described with reference to the following drawing figures wherein like reference numbers identify like parts throughout.

DETAILED DESCRIPTION OF THE INVENTION

Figure 1:
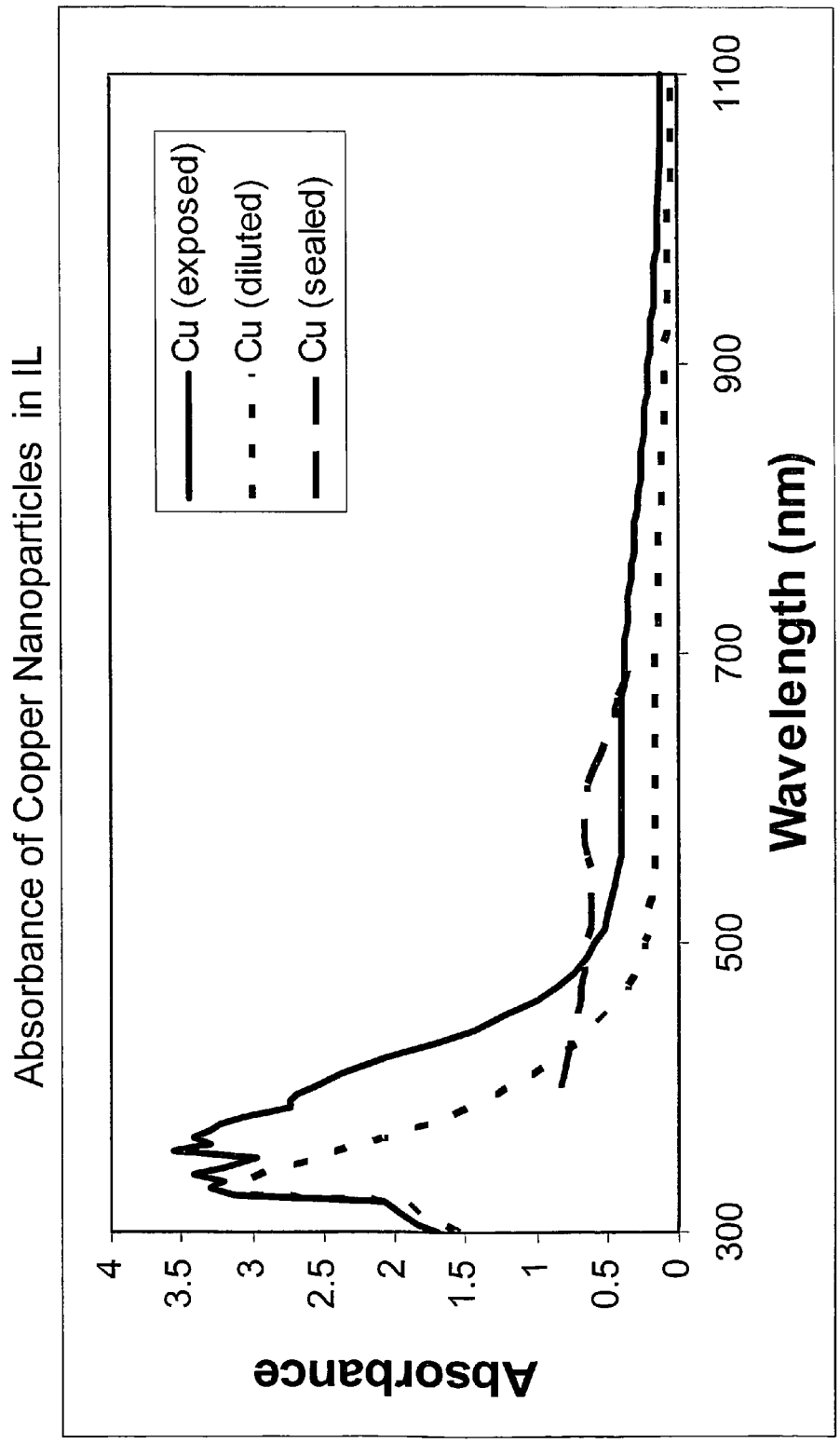
FIG. 1 is a graph of absorbance versus wavelength for Cu nanoparticles formed in accordance with the invention.

As used herein, spatial or directional terms, such as "left", "right", "inner", "outer", "above", "below", and the like, relate to the invention as it is shown in the drawing figures. However, it is to be understood that the invention can assume various alternative orientations and, accordingly, such terms are not to be considered as limiting. Further, as used herein, all numbers expressing dimensions, physical characteristics, processing parameters, quantities of ingredients, reaction conditions, and the like, used in the specification and claims are to be understood as being modified in all instances by the term "about". Accordingly, unless indicated to the contrary, the numerical values set forth in the following specification and claims may vary depending upon the desired properties sought to be obtained by the present invention. At the very least, and not as an attempt to limit the application of the doctrine of equivalents to the scope of the claims, each numerical value should at least be construed in light of the number of reported significant digits and by applying ordinary rounding techniques. Moreover, all ranges disclosed herein are to be understood to encompass the beginning and ending range values and any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 1 to 3.3, 4.7 to 7.5, 5.5 to 10, and the like. Further, as used herein, the terms "formed over", "deposited over", or "provided over" mean formed, deposited, or provided on but not necessarily in contact with the surface. For example, a coating layer "formed over" a substrate does not preclude the presence of one or more other coating layers or films of the same or different composition located between the formed coating layer and the substrate. As used herein, the terms "polymer" or "polymeric" include oligomers, homopolymers, copolymers, and terpolymers, e.g., polymers formed from two or more types of monomers or polymers. Additionally, all documents, such as but not limited to issued patents and patent applications, and all websites referred to herein, are to be considered to be "incorporated by reference" in their entirety.

In one non-limiting embodiment, the invention provides a method to produce particles, such as but not limited to nanoparticles, in an ionic liquid (IL) at room temperature using a physical vapor deposition process. In one non-limiting embodiment, an IL is introduced into the deposition chamber of a conventional physical vapor deposition device, such as a conventional sputter deposition device or a conventional electron beam evaporation device. The deposition chamber is evacuated and one or more cathodes are used to sputter deposit one of more materials onto the IL. Any conventional cathode can be used. Suitable cathodes include, but are not limited to, metal-containing cathodes, semi-metal containing cathodes, and carbon cathodes, just to name a few.

ILs are salts that are liquid at temperatures less than or equal to 400° C. Non-limiting ionic liquids suitable for the practice of the invention include combinations of cations and anions. The cations can include mono-, di-, and trisubstituted imidazoliums; substituted pyridiniums; substituted pyrrolidiniums; tetraalkyl phosphoniums; tetraalkyl ammoniums; guanidiniums; isouroniums; and thiouroniums. The anions can include chlorides; bromides; iodides; tetrafluoroborates; hexafluorophosphates; bis(trifluoromethylsulfonyl)imides; tris(pentafluoroethyl)trifluorophosphates (FAPs); trifluoromethanesulfonates; trifluoroacetates; methylsulfates; octylsulfates; thiocyanates; organoborates; and p-toluenesulfonates. Specific non-limiting examples of ILs include 1-butyl-3-methylimidazolium hexafluorophosphate ([BMIM]$PF_6$), 1-hexyl-3-methylimidazolium tetrafluoroborate ([HMIM]$BF_4$), 1-butyl-3-methylimidazolium tetrafluoroborate ([BMIM]$BF_4$), 1-ethyl-3-methylimidazolium trifluoromethane sulfonamide ([EMIM]$(CF_3SO_2)_2N$). Other non-limiting ILs are available from Solvent Innovation GmbH of Cologne, Germany and are listed at http://www-.solvent-innovation.com/index_overview.htm. Still other ILs are available from Merk KGaA of Darmstadt, Germany. Variations in cations and anions can produce millions of ionic liquids that can be fine tuned for specific applications.

ILs are also solvents that can be reacted, recycled and polymerized. As a result, they have broad applications in industry, e.g. catalysis, synthesis, electrochemistry, medicine, sensors, lubricants, and separations. In addition, ILs have negligible vapor pressure and exhibit high thermal stability. These properties make them an environmentally friendly solvent with regard to VOC (Volatile Organic Compounds), as compared to common organic solvents, e.g. alcohols, toluene, methylene chloride to name a few.

It was found in the present invention that when a vapor produced by physical vapor deposition (PVD) was deposited over an IL in a vacuum system, nanoparticles were produced and that ionic liquids acted as stable reservoirs for the particles. Magnetron sputtering was the method used to deposit the vapor in the following examples. However, any physical deposition process carried out in a vacuum system can be used to produce particles. An advantage of the invention over the known art is the capability of containing a liquid in a vacuum system, wherein the liquid has negligible effect on the pressure in the system. The low base and deposition pressures required for vacuum coating processes are achieved as if there were no liquid present in the system. Another advantage of an IL is that it is a universal solvent that lends itself to chemical processing (see AIChE Journal, (November 2001) Vol. 47, pages 2384-2389 for IL's in Chemical Processing). The nanoparticles of the invention are incorporated into an IL, thus eliminating steps for transfer into a medium for further processing and/or eliminating multi-step chemical processing steps. Additionally, it has been shown that the volume of the deposited particle is proportional to the deposition pressure, thus a lower deposition pressure is ideally suited not only for running a stable process free from contamination, but also for consistently and reliably producing particles within a desired particle size range, e.g. a nanoparticle size range. As used herein, "particle" or "nanoparticle size range" means particles having a maximum dimension of no greater than 500 nm, such as no greater than 200 nm, e.g. no greater than 100 nm, or no greater than 50 nm, or no greater than 10 nm, such as in the range of 0.1 nm to 200 nm, such as in the range of 0.5 nm to 200 nm, such as in the range of 1 nm to 200 nm. The deposition process is carried out at pressures of no greater than 50 microns of Hg, for example no greater than 20 microns of Hg, such as no greater than 10 microns of Hg, such as no greater than 7 microns of Hg, or no greater than 5 microns of Hg, such as no greater than 4 microns of Hg, such as no greater than 3 microns of Hg, or no greater than 2 microns of Hg, such as no greater than 1 micron of Hg. As will be appreciated, one micron is equivalent to 0.001 Torr. In addition, the IL does not require any additives that will increase the vapor pressure, to prevent particle agglomeration, and limit the capability of the process to run at low pressure. Additives that increase the viscosity but do not affect the vapor pressure can also be utilized. ILs of different viscosities can be mixed to adjust the viscosity of the final liquid.

The following non-limiting examples illustrate various aspects of the invention. In these examples, copper, silver, and tungsten oxide were sputtered deposited on the ionic liquid in a vacuum system. The vacuum system base pressure, which was in the range of $10^{-6}$ to $10^{-7}$ torr, did not change appreciably differently than a conventional solid substrate after the liquid was introduced, accounting for the negligible vapor pressure of ionic liquids. This also enabled the deposition at pressures of 7 microns of Hg or less. There was no change in pressure during deposition. Nanoparticles were formed in the liquid as a result of the deposition into the liquid.

To illustrate the invention, the method of making and characterizing several of the materials are described in detail below. Samples were prepared by wetting the surface of a clear float glass substrate with an ionic liquid (IL) using an eyedropper to cover about 1.5 inches (3.8 cm) square to a depth of less than a millimeter. A spatula was used to aid in spreading the liquid over the surface. The glass substrate containing the IL was 3 inches (7.6 cm) square. The substrate was then placed on a carrier plate, placed in the entry lock of an Airco Temescal ILS 1600 vacuum coater, and evacuated before entry into the deposition chamber, which was set at a base pressure of less than $10^{-6}$ torr. All coatings were deposited by DC magnetron sputtering between the pressures of 1 and 7 microns of Hg. The substrate moved under the sputtering target as a speed of 120 inches/min (3 m/min). There was no change in pressure after the sample containing the IL entered the chamber, or during the deposition process. The coating thickness was measured using a Tencor P1 stylus profilometer unless otherwise indicated.

EXAMPLE 1

This example illustrates the formation of copper nanoparticles. Copper was deposited from a copper target at a constant power of 1.5 kW, a voltage of 508 volts, and a current of 2.95 amps in an argon gas atmosphere at a pressure of 4 microns of Hg. The substrate passed under the target 20 times. After deposition, the sample was removed from the chamber. The area of the glass surface surrounding the ionic liquid ([BMIM]$PF_6$ described above) was covered with a copper film, as expected. The IL, however, appeared unchanged, except for a transmitted color that appeared reddish-brown in color, and which developed a greenish component after about 4 minutes. If the copper containing IL were left in the coater under vacuum for at least 4 minutes, and then removed, the IL was the reddish-brown color without the greenish hue. However, the hue developed after about 4 minutes, as previously described. If the sample was covered with glass plate upon removal from the coater, the solution remained reddish-brown and did not develop a greenish hue. This indicates that some of the copper particles may be forming copper oxide or copper hydroxide in the IL due to oxygen and water vapor in the atmosphere, and/or that some of the particles are agglomerating.

When the IL containing the copper was removed from the surface of the glass substrate by rinsing with acetone into a collection dish, there was no coating where the IL had been and there was a sharp boundary formed by the copper film. This indicated that the copper deposited on the IL remained in the IL, and that there was no outgassing, splattering or reaction at the liquid-film boundary either before or during deposition. The boundary was used to measure the film thickness, which was 353 nm. This is equivalent to about 344 μg per square cm of copper, as calculated from the density derived from XRF measurements for sputtered copper films.

The copper particles formed by the method were analyzed by FESEM (Field Emission Scanning Electron Microscopy) and EDX (Energy Dispersive X-ray) analysis using a LEO 1530 SEM and a Noran Vantage EDS/EDX, respectively. The advantage of using this analysis is that it gives visual observation of the particles and particle size (FESEM) with elemental verification (EDX). The agglomerated particles were removed from the bulk of the IL since the background signal from the IL interfered with the particle signal, and reducing the amount of IL increased the signal strength from the particles. Only agglomerated particles or particles that became agglomerated by the removal process were extracted from the IL. The particle removal was performed by diluting the copper containing IL in the dish several additional times with acetone, removing acetone and IL after each dilution with filter paper, further diluting with a 50% isopropanol-deionized water mixture, and then pouring off the liquid. The procedure resulted in agglomerated copper particles in a residue of dilute IL, a portion of which were then transferred to Scotch® brand tape for FESEM analysis. The unagglomerated particles remained in suspension in the IL. The presence of unagglomerated particles was confirmed by spectrophotometric measurements.

Spectrophotometric measurement and analysis is another technique used to measure the presence of nanoparticles by observing the presence of absorption peaks at characteristic wavelengths. In particular, the surface plasmon resonance (SPR) for a metal at a characteristic wavelength which is a function of both the particle material and size and the medium containing the particle was used to identify the presence of metal nanoparticles in solution in the IL. The advantage of this technique is that the particles remain in solution and in an unagglomerated state. The background signal from the IL, which is small, is substracted out, or it can be ignored if it is negligible compared to the sample signal. The samples can also be sealed from the atmosphere, as described above, and measured.

Spectrophotometric measurements were used to analyze copper containing IL samples (i.e. the IL prior to dilution as discussed above in Example 1) for the presence of copper nanoparticles. The tested sample did not appear to include any visible agglomerated particles. The absorption spectrum of two types of samples were measured: samples that were exposed to the atmosphere after removal from the coater (referred to as "exposed"), and samples that were covered with a clear float glass plate and sealed immediately after removal from the coater (referred to as "sealed"). The exposed samples were measured using a Perkin-Elmer Lambda 2 UV/VIS/NIR spectrophotometer between 300 nm and 1100 nm. For transparency in the UV region of the spectrum, quartz curvets (Fisher Far UV Rectangular 1 mm) were used to contain the exposed samples. Two exposed samples were measured: the copper containing IL, and the copper containing sample diluted with additional IL of the same type (referred to as "diluted").

The sealed sample was measured on a TCS spectrophotometer, available from BYK Gardner USA, between 400 and 700 nm. The TCS spectrophotometer was used since float glass is less transparent in the UV region, dropping off rapidly in transmittance at less than 350 nm (83% at 350 nm to 3.5% at 300 nm at 2.3 mm thickness). However, the characteristic wavelength for absorption occurs in the visible region of the spectrum.

FIG. 1 shows the absorbance of the three copper containing ILs. The sealed sample shows an absorption peak at about 580 nm. This is attributed to the surface plasmon resonance (SPR) absorption for copper nanoparticles having a maximum dimension of no greater than 100 nm. It is believed that the steep onset of absorption at 500 nm for the exposed and diluted Cu samples indicates the presence of copper oxide and copper hydroxide nanoparticles.

Figure 2:
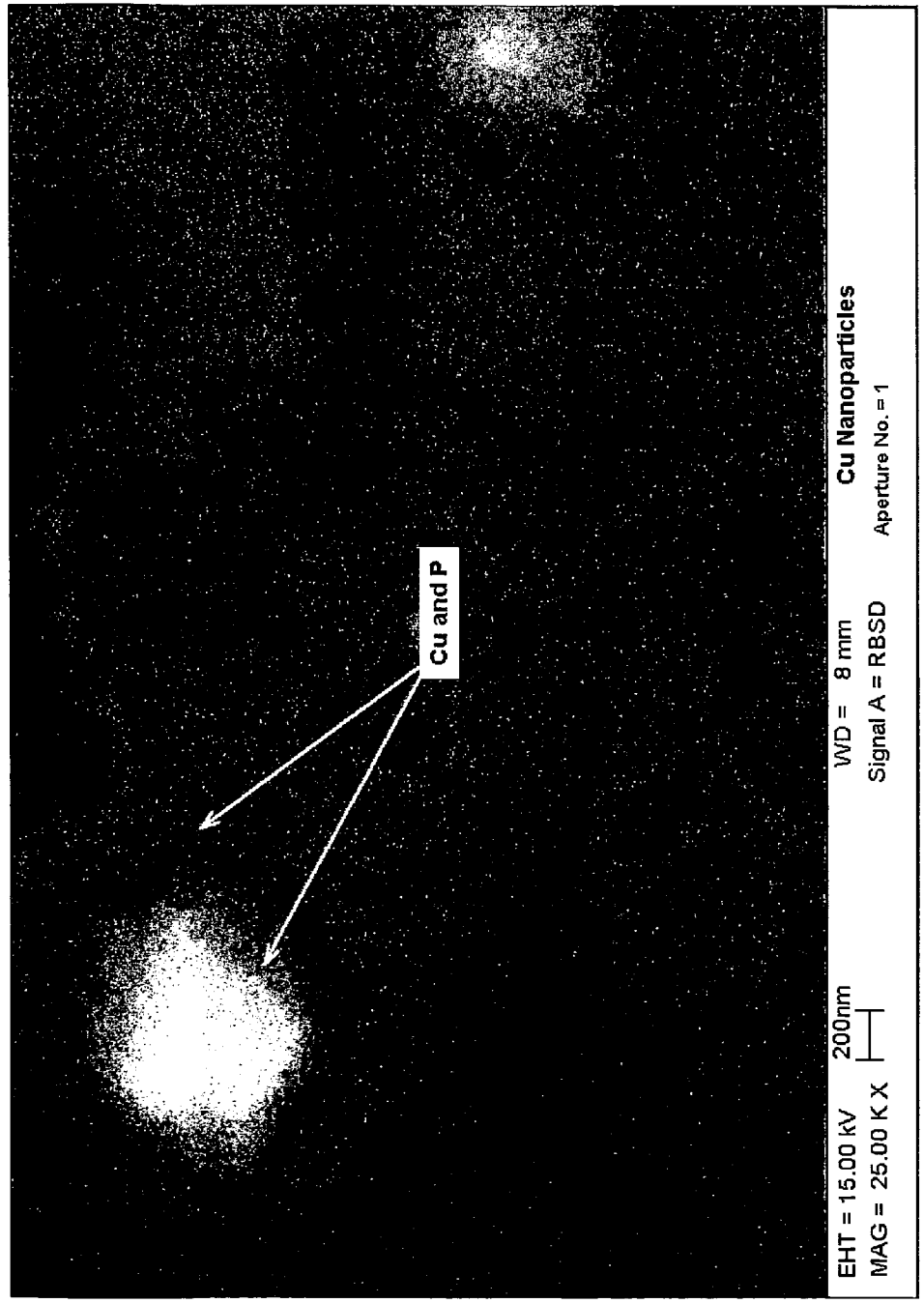
FIGS. 2 and 3 are FESEM (Field Emission Scanning Electron Microscopy) Cu nanoparticles.
Figure 3:
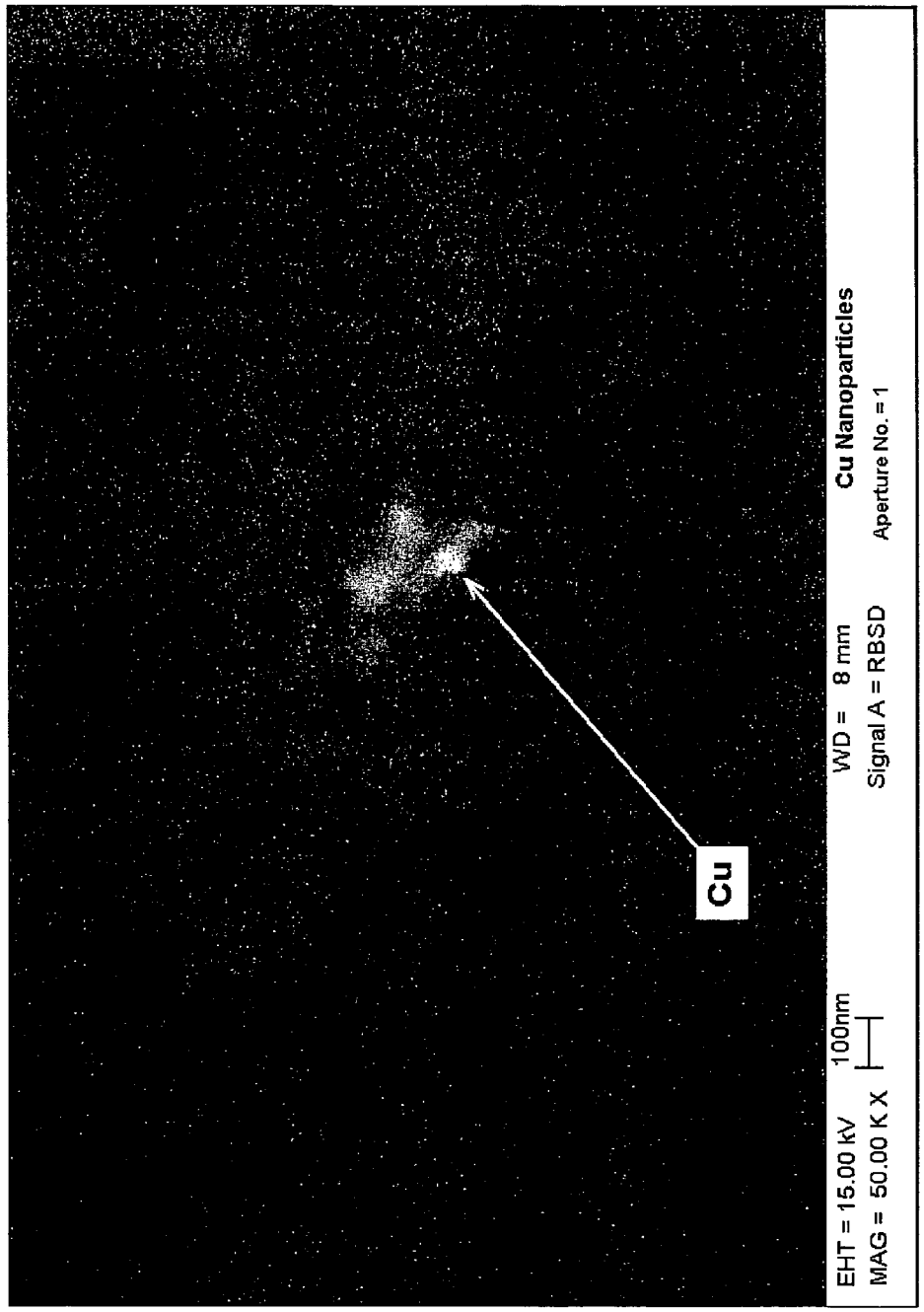
Figure 4:
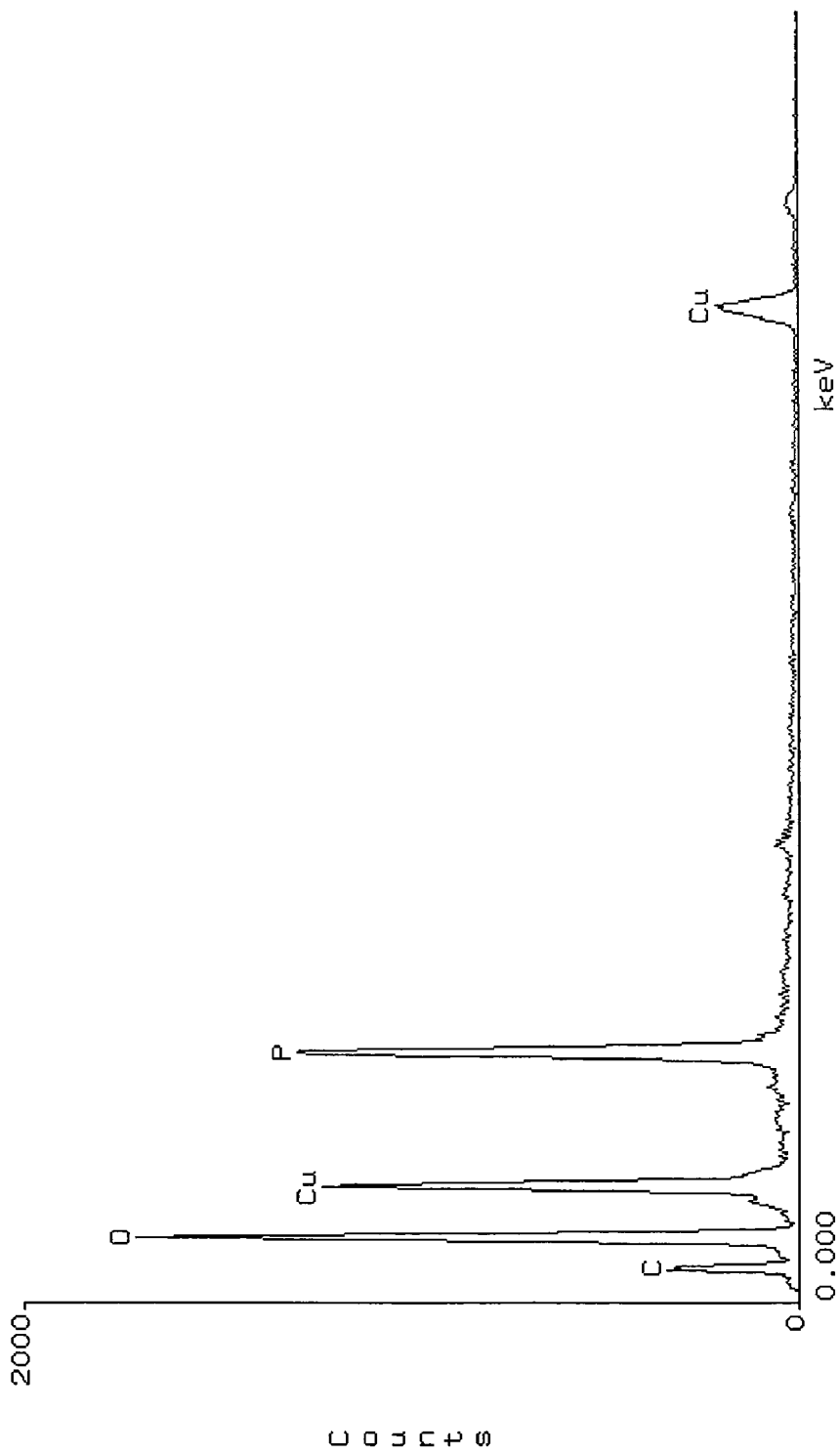
FIG. 4 is an EDX (Energy Dispersive X-ray) of Cu nanoparticles.

The FIGS. 2 and 3 show the FESEM for the samples of the agglomerated copper particles in the residue IL on the Scotch brand tape. The particles, limited in this sampling due to the difficulty of completely extracting the copper from the IL, show particles having a maximum dimension of no greater than 100 nm. They represent the upper limit of the particle size. The EDX analysis in FIG. 4, shows copper and the background phosphorous (P) from the IL.

EXAMPLE 2

This example illustrates the formation of silver nanoparticles. Silver was deposited in a manner similar to the method described in Example 1 for copper. The silver was deposited at a constant power of 3.0 kW, a voltage of 599 volts, and 5.0 amps in an argon gas atmosphere at a pressure of 4 microns of Hg. The substrate passed under a silver target 10 times. The silver containing IL was removed from glass substrate by rinsing in acetone into a collection dish. The silver film thickness was 463 nm as measured at the boundary between the film and the uncoated area that contained the IL. This is equivalent to about 470 μg per square cm of silver as calculated from the density derived from XRF measurements for sputtered silver films. The particle removal was performed by diluting the silver containing IL in the dish several additional times with acetone, removing acetone and IL after each dilution with filter paper. The acetone was then allowed to evaporate until a film of agglomerated silver nanoparticles was left.

Figure 5:
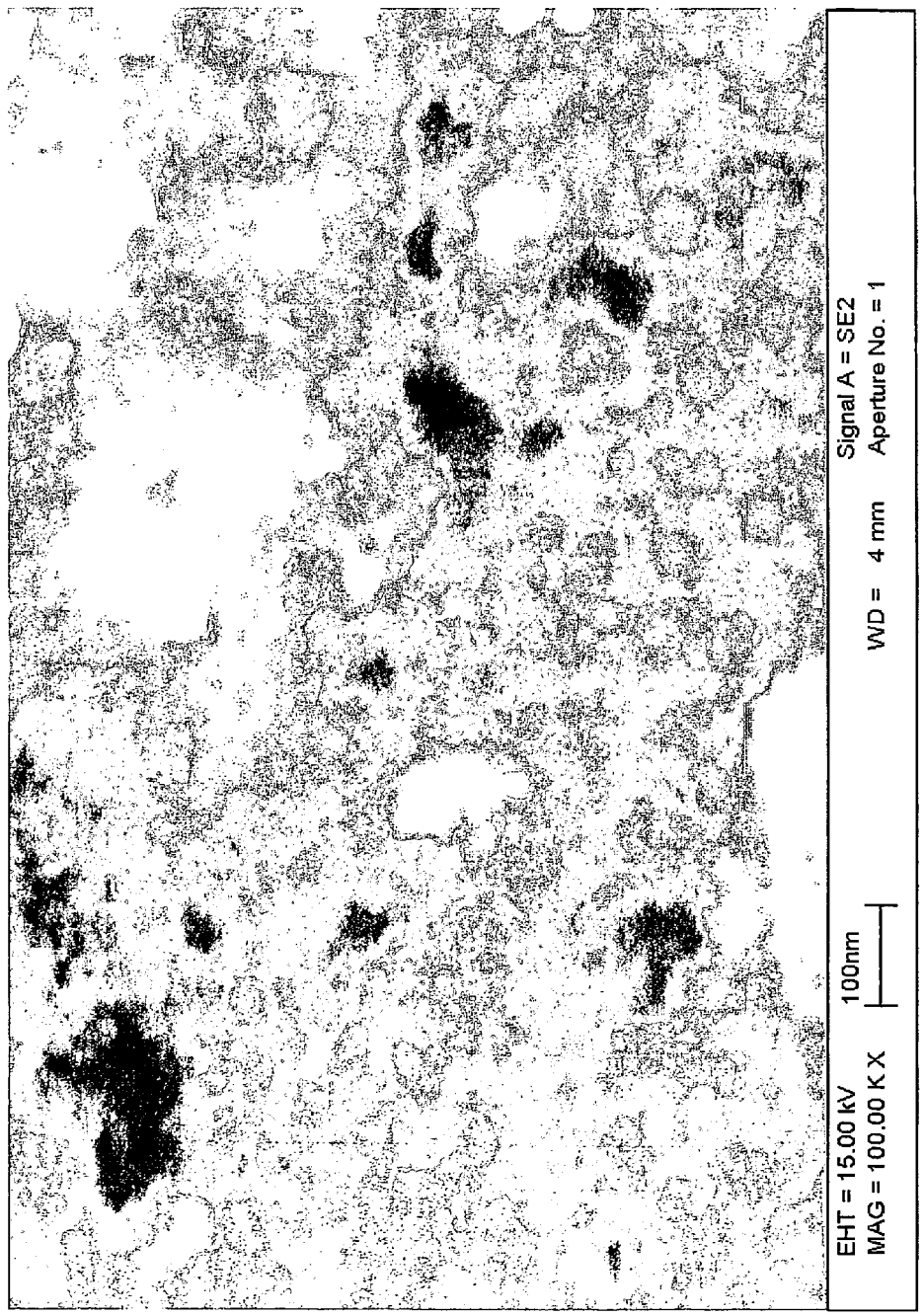
FIGS. 5 and 6 are FESEM of Ag nanoparticles.
Figure 6:
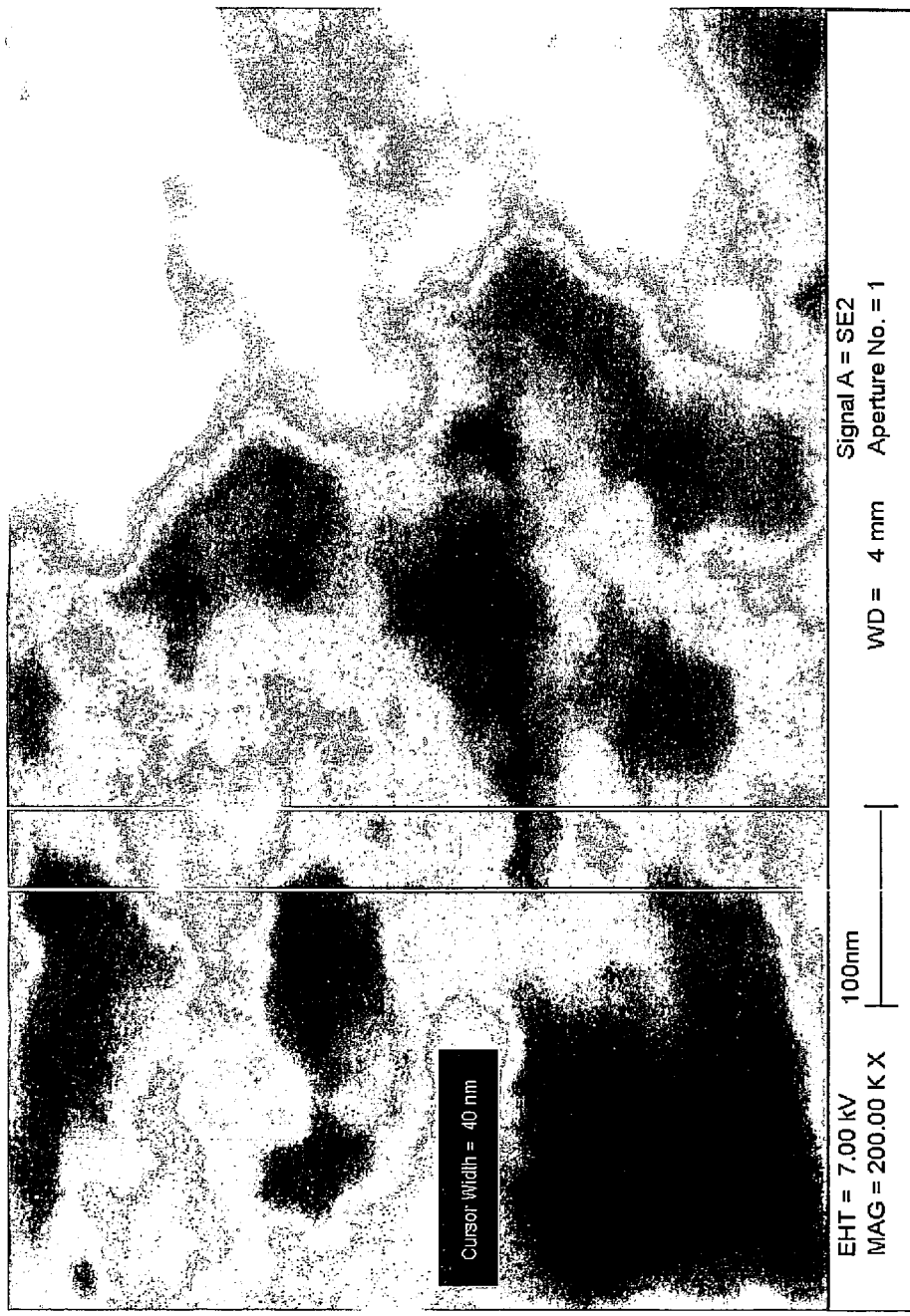
Figure 7:
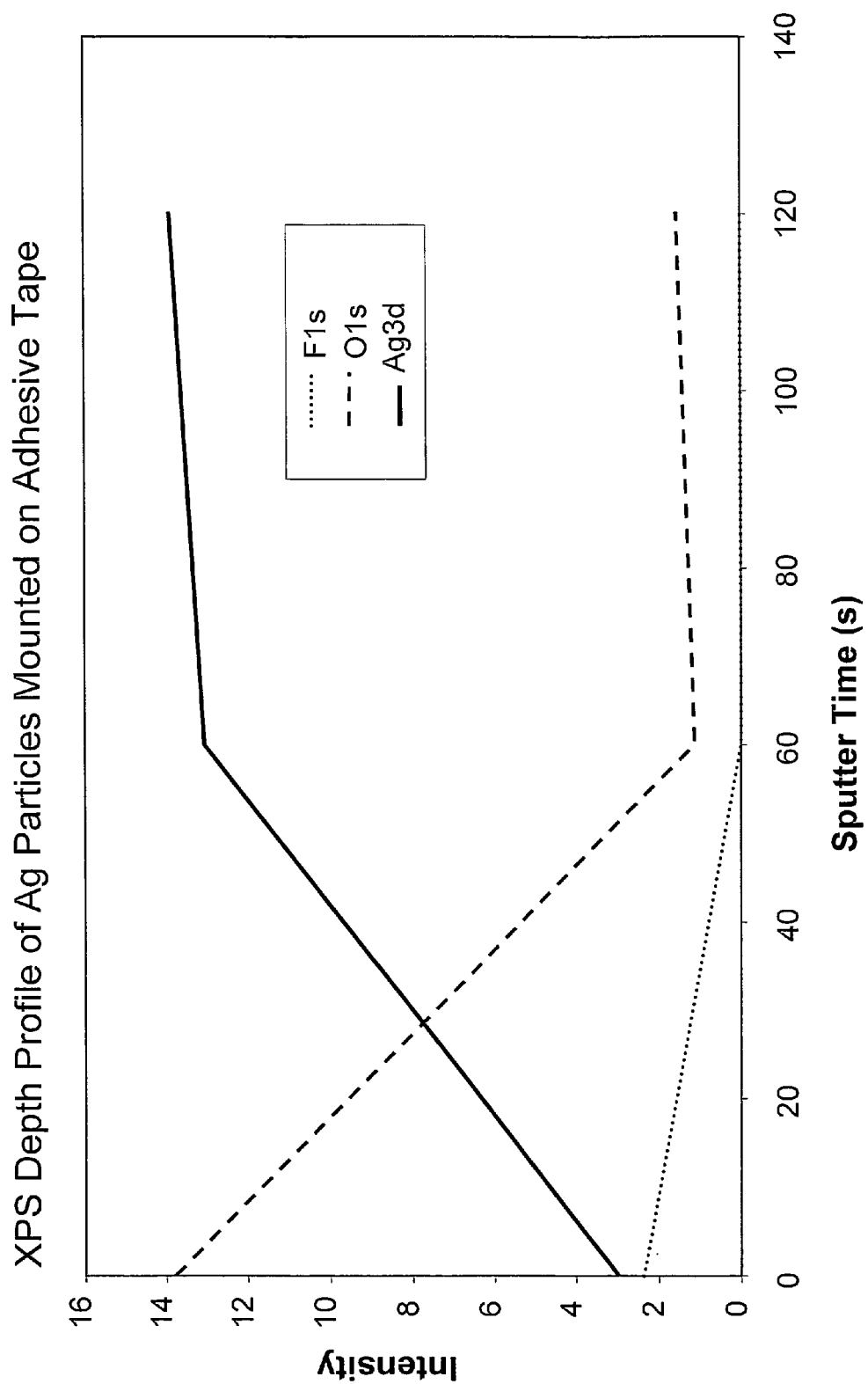
FIG. 7 is an XPS (X-ray Photoelectron Spectroscopy) of Ag nanoparticles.

The film was then transferred to Scotch brand tape for FESEM and EDX analysis. The unagglomerated particles remained in suspension and were removed when the acetone was removed. The presence of unagglomerated particles was confirmed by spectrophotometric measurements in the same manner used for the copper. The FESEM images showed agglomerated silver formed from particles ranging in size from less than 10 nm up to about 100 nm (see FIGS. 5 and 6). Presence of elemental silver particles was confirmed by EDX analysis. The extracted silver sample on the Scotch brand tape was further analyzed by XPS (X-ray Photoelectron Spectroscopy) using a Thermo Electron ThetaProbe (Thermo Electron Corporation, West Sussex, England) to detect if any silver reacted with the IL. As expected, the surface of the sample showed carbon, oxygen and fluorine contamination. After removal of the surface contamination using argon ion bombardment (sputtering) at an accelerating voltage of 2 kV, only silver remained. This was confirmed by the presence of the silver metal $3d_{5/2}$ photoelectron. FIG. 7 shows the XPS intensity for silver mounted on tape. The F 1s signal vanishes and the Ag 3d signal increases after 60 sec of sputtering, indicating that there are only silver particles present, and no reaction with the ionic liquid. The O signal is due to the tape.

Figure 8:
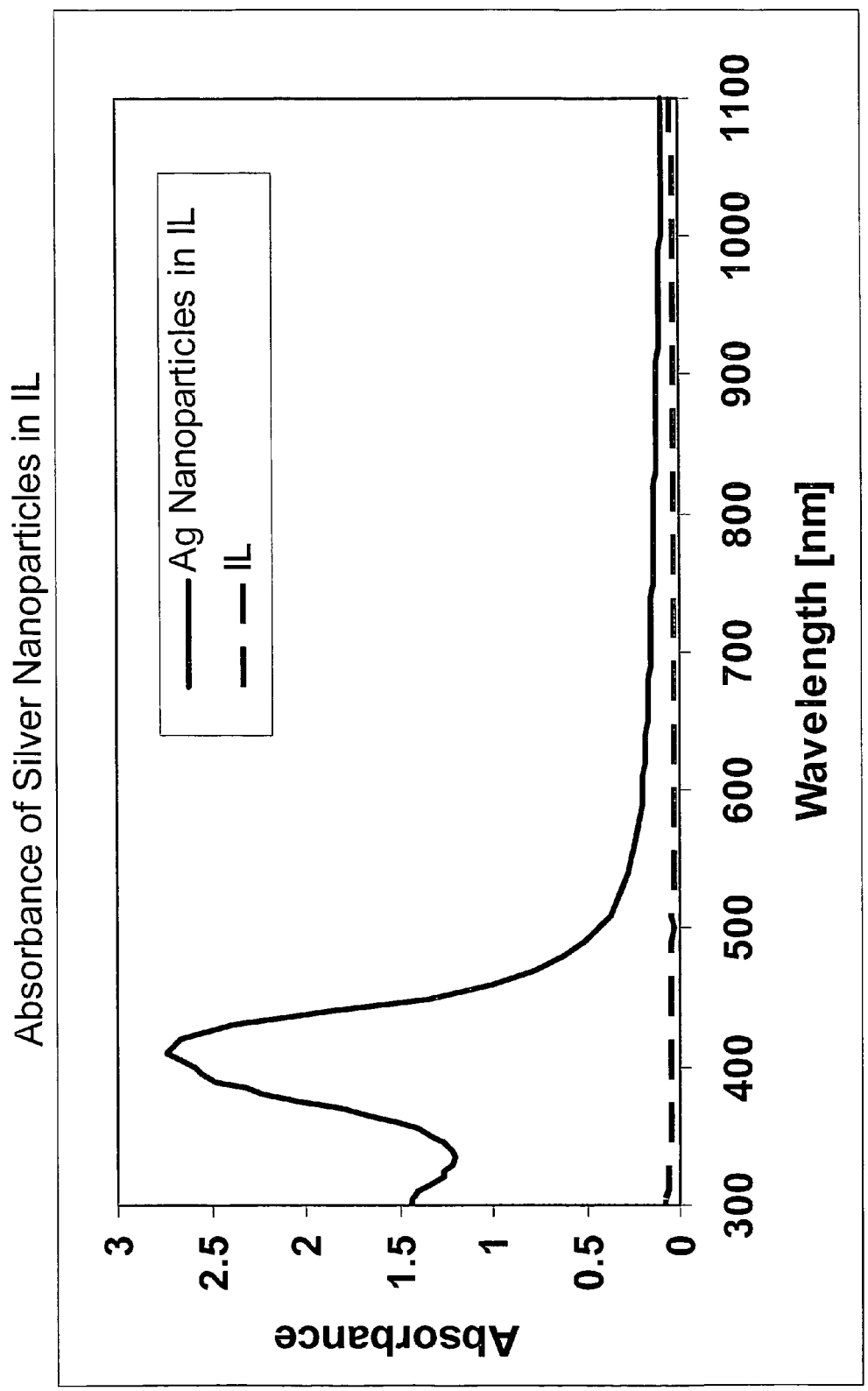
FIG. 8 is a graph of absorbance versus wavelength for Ag nanoparticles.

Spectrophotometric measurements of the silver containing IL was also measured in the manner described for the copper. Silver containing IL that was exposed to the atmosphere after deposition was transferred to the quartz curvet for measurement on the Lambda 2. Some of the agglomerated nanoparticles had separated out of solution and the tested sample did not include any visible agglomerated particles. FIG. 8 shows a strong absorption peak in spectrum for silver at about 410 nm for the sample. This is attributed to the surface plasmon resonance (SPR) absorption for silver nanoparticles. This measurement, along with the XPS measurement, indicates that there is no reaction with the IL or the atmosphere (moisture or oxygen).

The result of these analyses indicated that silver nanoparticles are created by deposition of silver into the IL. The particles had a maximum dimension of up to 100 nm, e.g. up to 50 nm, or up to 10 nm.

In addition, these results indicate for both copper and silver that a maximum amount of nanoparticles go into and remain in solution in the IL and any particles in excess of this maximum will agglomerate.

EXAMPLE 3

Figure 9:
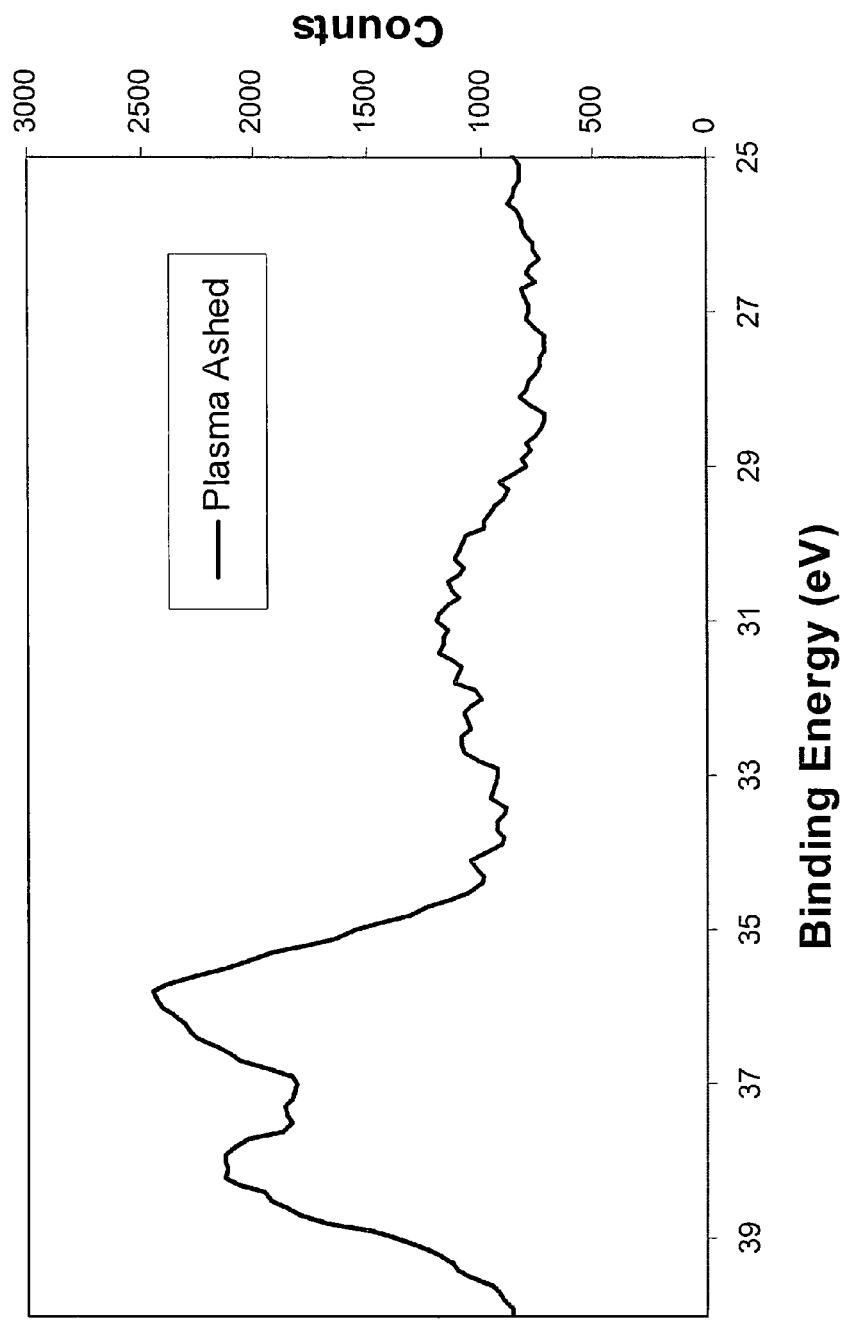
FIG. 9 is a graph of binding energy versus counts (XPS) for tungsten oxide nanoparticles.
Figure 10:
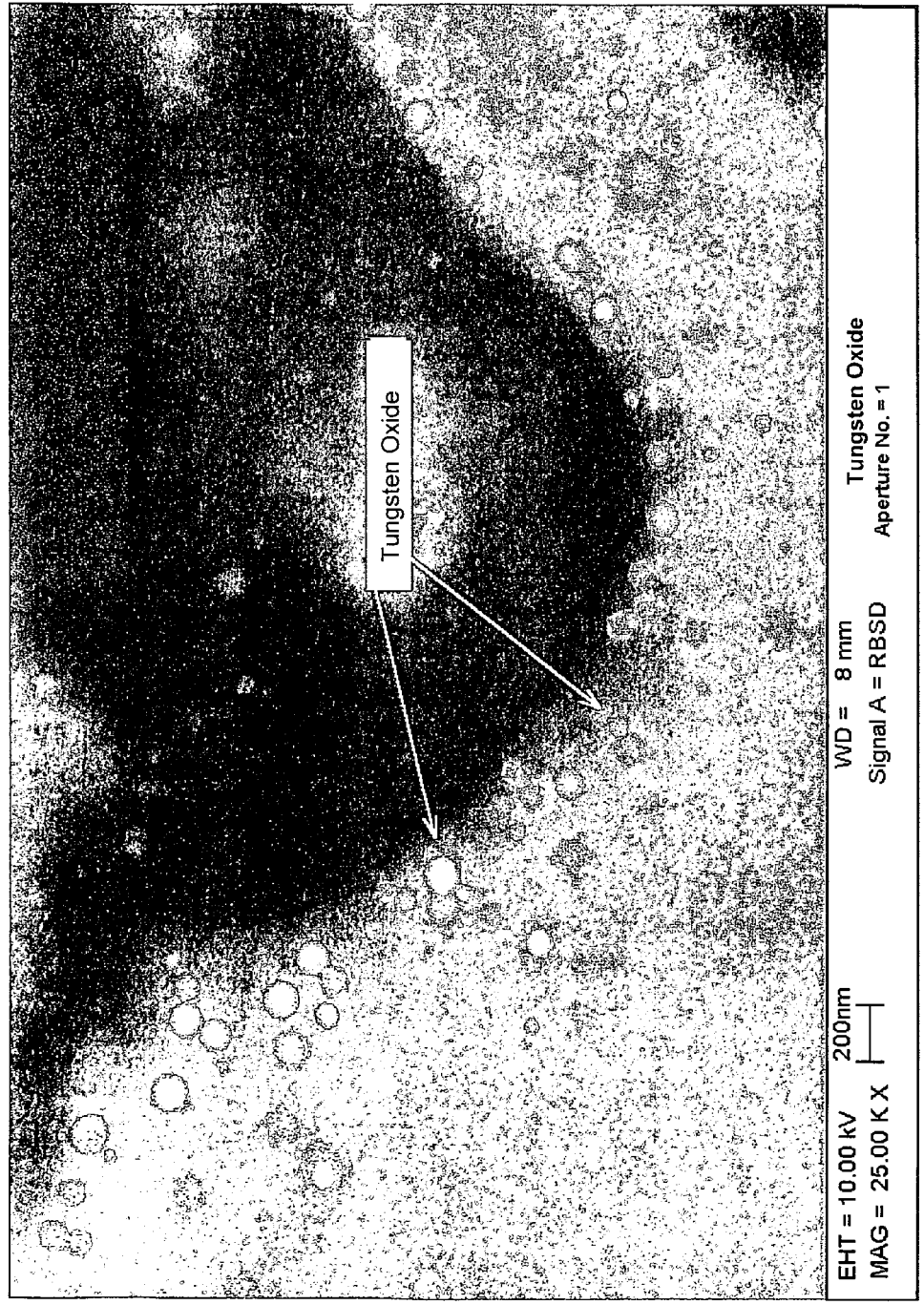
FIGS. 10 and 11 are FESEM of tungsten oxide nanoparticles.
Figure 11:
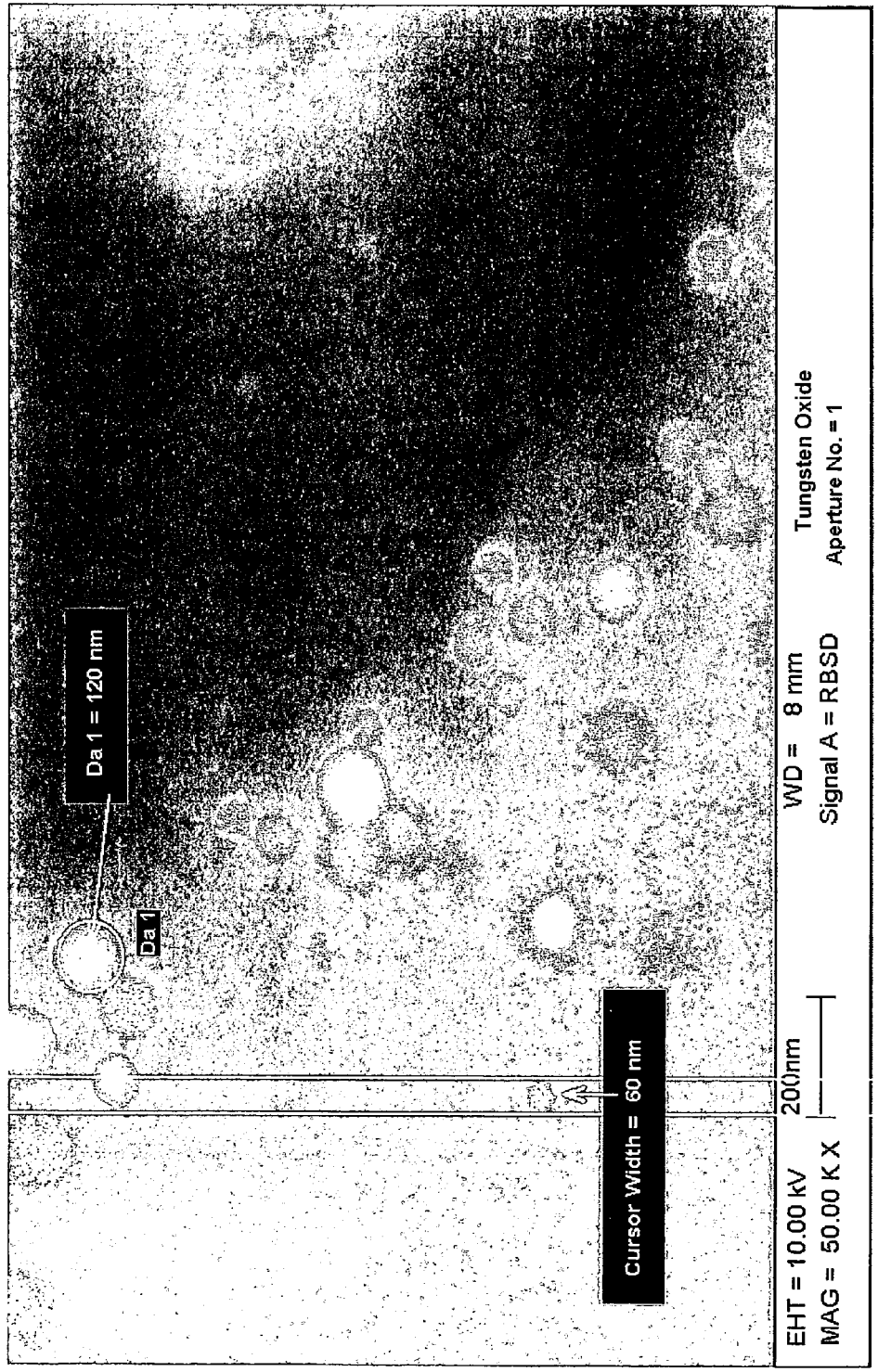
Figure 12:
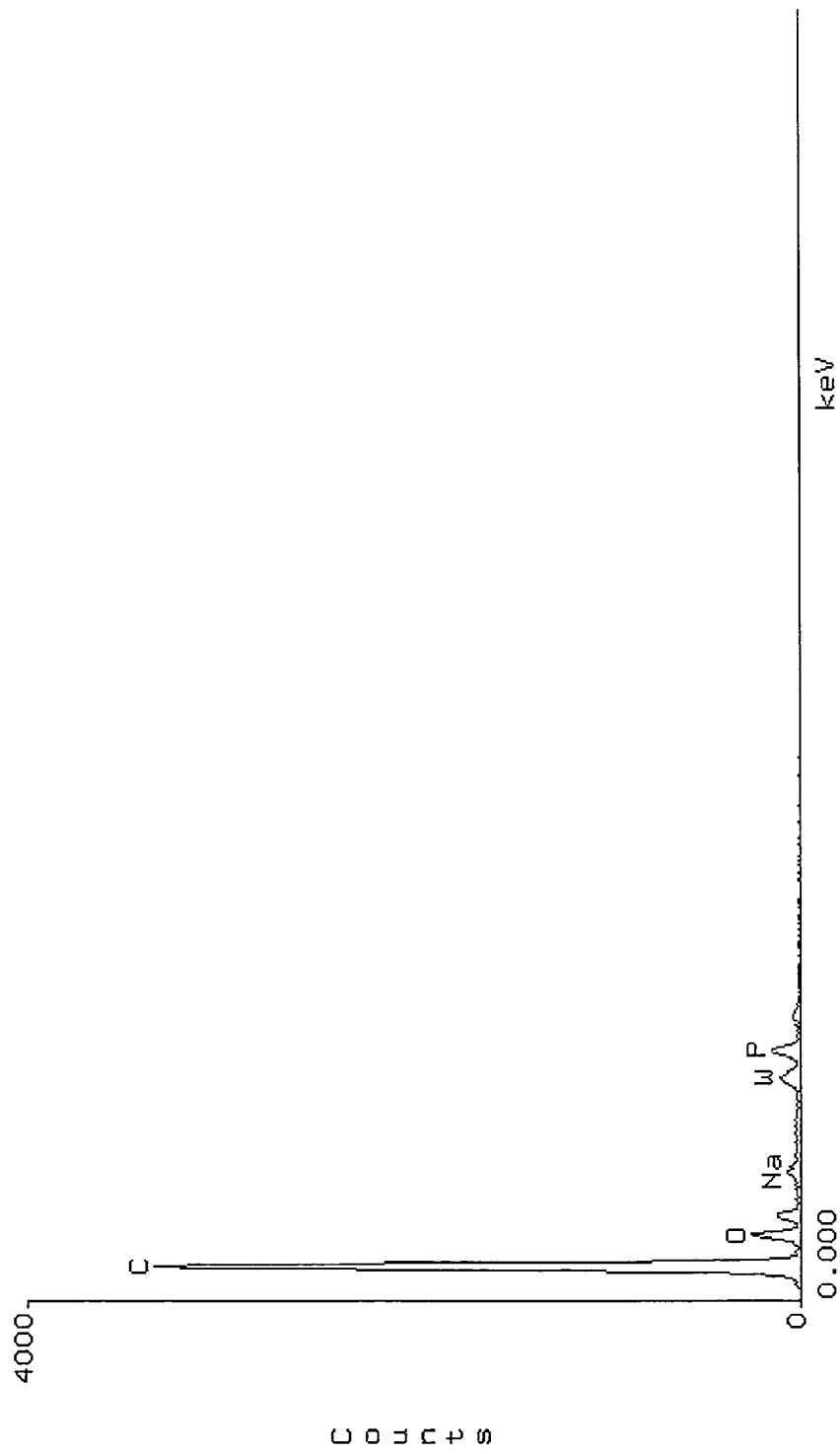
FIG. 12 is an EDX of nanoparticles comprising tungsten oxide.

This example illustrates the formation of tungsten oxide nanoparticles. Tungsten oxide was deposited in a method described above. A tungsten target was deposited in a reactive gas atmosphere of 50% $O_2$ and 50% Ar by flow at a pressure of 4 microns of Hg. The target was run at a constant power of 3.0 kW, a voltage of 486 volts, and a current of 6.24 amps. The substrate passed under a target 10 times. The tungsten oxide containing IL was removed from glass substrate by rinsing in acetone into a collection dish. The tungsten oxide was 117 nm thick (as determined in the manner discussed above). The tungsten oxide containing IL had a yellow appearance when viewed in transmittance. It is believed that this coloration is due to either the presence of tungsten oxide in the IL or a reaction of the plasma with the IL. The particle removal was performed by initially diluting the tungsten oxide containing IL in the dish with acetone and removing acetone and IL with filter paper. However, it was found that there was no visual evidence of agglomeration and any attempt to remove the acetone diluted IL resulted in absorbing both the liquid and $WO_3$. As a result, the acetone was allowed to evaporate. The remaining IL solution was then mixed with a 50% isopropanol-50% deionized water mixture, which resulted in the formation of small droplets (less than 1 mm in diameter) of tungsten oxide containing solution. The droplets were transferred to a silicon substrate and processed in a SPI Plasma-Prep II plasma asher to remove some of the IL, and analyzed using FESEM, EDX and XPS. The XPS verified that the droplets contained $WO_3$. The XPS chart (see FIG. 9) shows the tungsten oxide peak at 35.8 eV with a separation of 2.2 eV between the $4F_{7/2}$ and $4F_{5/2}$ peaks for the sample on a silicon substrate. (See http://srdata.nist.gov/xps/index.htm for the material database for XPS peak positions). The FESEM images (see FIGS. 10 and 11) showed individual particles of tungsten oxide. The images show particles having a maximum dimension of no greater than about 120 nm, e.g. no greater than 50 nm, or no greater than 10 nm. The particles appeared as well defined spheres. The EDX (see FIG. 12) confirms the presence of elemental tungsten.

EXAMPLE 4

This example illustrates increasing the viscosity of IL to change the properties of the deposited material.

It was found that the viscosity of the IL determines whether a nanoparticle or film will form when a material is deposited over the IL by PVD. To illustrate this, the viscosity of the IL was increased by dissolving a polymer in the IL, and different materials were magnetron sputter deposited over the solution.

The viscous solution was made by adding polyvinylpyrrolidone (PVP) powder (Type NP-K30, commercially available from GAF Corporation) in the concentration of 0.14 grams per ml of [BMIM]$PF_6$. The solution was then heated for 35 minutes at 90° C. to produce a clear, very viscous, and tacky solution with no noticeable flow when cooled to room temperature (21° C.). The solution was spread into circle of about 1.5 inches in (3.8 cm) diameter on a 3"×3" (7.6 cm by 7.6 cm) by 2.3 mm thick glass plate, and the surface was allowed to "smooth out" for a few minutes before being fixed to a 12"×12" (36.5 cm by 36.5 cm) carrier plate and placed in the vacuum chamber.

Figure 13:
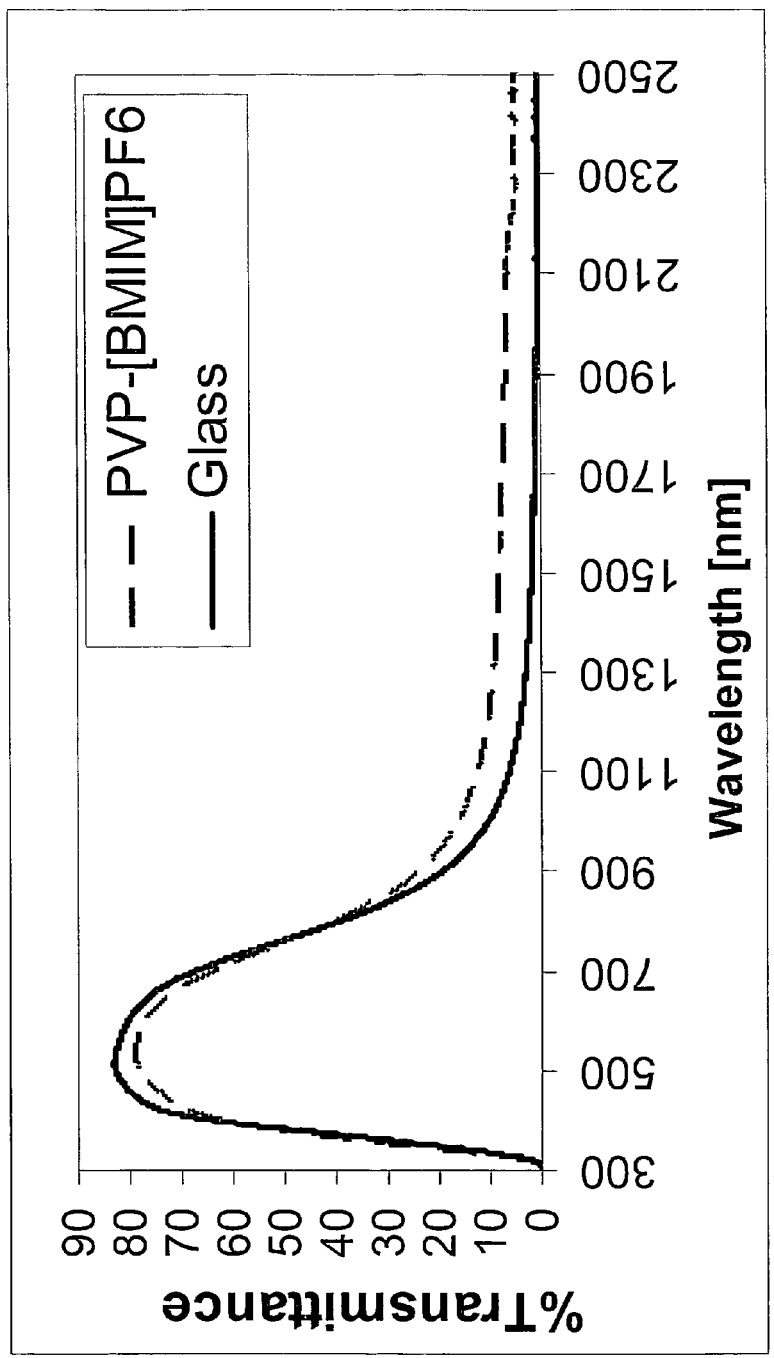
FIG. 13 is a graph of percent transmittance versus wavelength for a Ag-dielectric stack on different substrates.

Two samples were produced by magnetron sputter deposition over the PVP-IL solution. The first sample was produced by depositing silver in a manner similar to the method described earlier for silver and copper. The silver was deposited at a constant power of 1 kW, a voltage of 476 volts, and 2.1 amps in an argon gas atmosphere at a pressure of 4 microns of Hg. The substrate passed under a silver target 30 times. The silver layer was estimated to be 300 nm thick on the glass substrate. The second sample was deposited to form a multilayer low emissivity coating of the type conventionally used on glass. The coating comprised the following layers deposited in sequence by magnetron sputtering: $Zn_2SnO_4$/Zn-10 wt % Sn/Ag/Ti/$Zn_2SnO_4$/Zn-10 wt % Sn/Ag/Ti/$Zn_2SnO_4$ (referred to herein as an "Ag-dielectric stack"). Coatings of this type are known as "High T/Low E" (high transmitting/low emissivity) coatings and are described in U.S. Pat. Nos. 4,898,789 and 4,898,790. After deposition, the coatings were removed from the chamber and visually examined. In contrast to the appearance of the samples where nanoparticles deposited in the pure IL, a coating appeared over the PVP-IL solution. The general appearance of the coating over the solution was the generally the same as the coating on the adjacent glass surface. The silver coating had a slightly wrinkled appearance due to the uneven nature of the fluid below. The multilayer coating had some cracking, probably due to the flow of the solution combined with adhesion to the coating layers. The multilayer coating still had the same general appearance as when it was first deposited, after ten months of storage in a covered square Petri dish. There was slightly more deterioration of the coating around the crack due to the exposure of the edges. This would be expected for coatings of this type. After the same time period, some parts of the silver coating had luster, as did some parts of the silver coating on the adjacent glass surface. Likewise, others sections were tarnished. The spectrum in FIG. 13 shows the percent transmittance from 300 and 2500 nm for the PVP-IL solution and the glass substrate coated with the Ag-dielectric stack after 10 months. There is a slight decrease in visible (400-780 nm) and slight increase in the solar infrared (800-2500) transmittance compared to the glass substrate. This is due to the cracking in the coating over the PVP-IL solution. Considering the coating was left unprotected (these coatings are sealed in a unit under a dry inert gas when used commercially) and that it was on a PVP-IL solution for 10 months illustrates that [BMIM]$PF_6$ has a negligible corrosive effect on the silver based coating.

Although the viscosity of the solution was not measured, it can be appreciated that viscosity has a strong influence on determining the form of the material deposited over the solution, i.e., particle or film. The published value of the viscosity of pure [BMIM]$PF_6$ is 312 centipoises (cP). In one non-limiting embodiment, suitable IL viscosities for the practice of the invention can be no greater than 1500 cP, such as no greater than 1110 cP, such as in the range from 66 to 1110 cP at room temp (23° C.). As the viscosity of the solution increases, the condition will be reached where the particles no longer enter the solution, but instead form a film over the solution, i.e., the flux of deposited material will see a surface that behaves more like a solid than a liquid. For the range of viscosity where the particles form in the solution, the properties of particles such as size and shape will be affected. This can be accomplished by decreasing the concentration of the solute in the IL and depositing over the solution. Any material which goes into solution with an IL and is suitable for PVD can be used.

For the above examples, the polymer was added before deposition to control film or particle formation. If certain properties of either the solution, or particles, or film are desired, then different amounts of polymer or IL can be added either before or after, or both before and after deposition. For example, if a certain particle size is desirable at a viscosity that is different than the final viscosity of the solution, then the solution that produces the certain particle size is coated, and additional polymer or IL is added after deposition to achieve the desired viscosity for the final polymer-IL solution. Polymers can be the same or different polymers. The ionic liquid can also be adjusted where a combination of IL can be added to get the desired solution in combination with a polymer or combination of polymers. In all cases the polymer can be replaced by a monomers and the monomer can be polymerized after deposition. In an alternative application, the polymer can be removed leaving the IL, or the IL and the polymer in solution could be rinsed away to produce a free standing film for subsequent processing into, e.g., flake for pigment. In another application the layers with a coating deposited over the solution or particles in solution can be laminated in combination with other materials, for example organic or inorganic layers, or more specifically polymers or glass layers.

The viscosity of the IL can affect the size distribution of particles in the IL. If the viscosity is sufficiently high, one or more films can be deposited over the IL. The IL can be subsequently dissolved or removed in conventional manner to leave the film, which could be used as a pigment or incorporated into a medium with or without a pigment. For ILs having particles dispersed therein, the IL can be used as a carrier for further processing of the particles or as a reactant in further processing steps.

EXAMPLE 5

This example illustrates a method for producing nanoparticle catalysts in an IL.

Stable transition-metal nanoparticles with controlled size and composition can be obtained chemically by the reduction or oxidation of metal compounds in the presence of protective agents such as surfactants, polymers or organic ligands to avoid particle agglomeration. The chemical synthesis and use of transition metal catalysts in ionic liquids have recently been reported. ILs allow the preparation and stabilization of transition-metal nanoparticles and enable easy catalyst recycling and product separation. An advantage of using nanoparticles in IL is the capability of recycling the catalyst numerous times in catalytic reactions without significant loss in catalytic activity. Ir and Ru have been prepared to produce catalytic systems.

Physical vapour deposition into an IL offers an alternative approach requiring only a one-step process and no chemical by-product to produce nanoparticles in a stable medium that enables easy recycling and requires no additional agents to prevent particle agglomeration either before or after deposition, although an agent may be added after deposition.

To illustrate this, a sample was produced by magnetron sputter deposition of Ir over a solution of [BMIM]$PF_6$ and of [BMIM]$BF_4$. The samples were produced by depositing iridium from an Ir target in a manner similar to the method described earlier for silver and copper. The iridium was deposited at a constant power of 3 kW, a voltage of 590 volts, and 5.08 amps in a 100 percent argon gas atmosphere at a pressure of 4 microns of Hg. The substrate passed under an iridium target 15 times. The Ir containing IL had a brownish appearance in transmittance after removal from the chamber. The iridium layer on the glass was 120 nm thick as determined by measuring the cross-section using Scanning Electron Microscopy (SEM).

Figure 15:
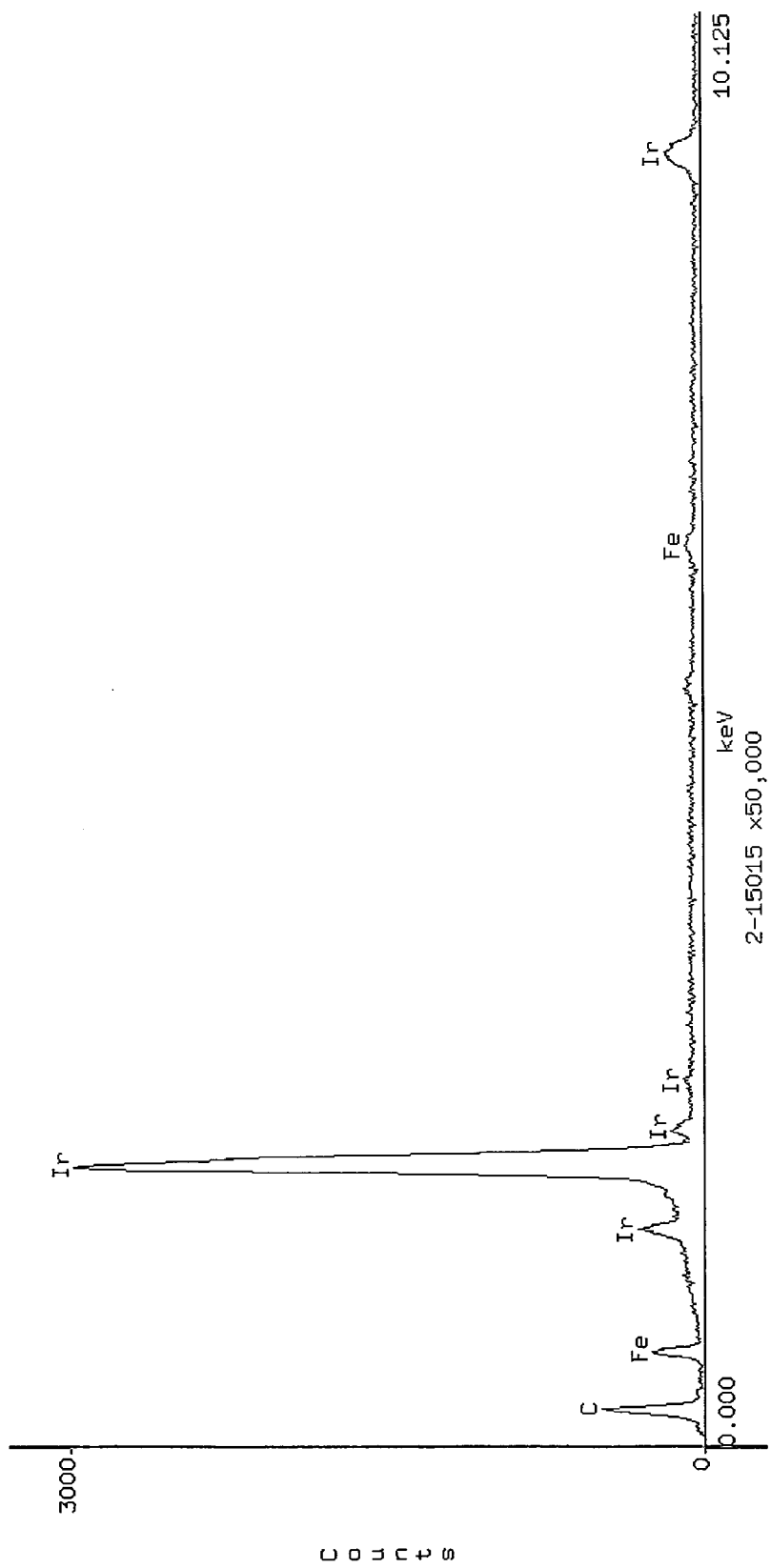
FIG. 15 is an EDX of Ir nanoparticles.

The [BMIM]$BF_4$ containing Ir nanoparticles was transferred to a carbon base for FESEM analysis. A small amount (about 5 drops) was placed on a carbon base for FESEM analysis. A small amount of deionized water was used to dilute the IL solution, which caused the Ir nanoparticles to agglomerate. The water was allowed to dry and the procedure of diluting and drying resulting in an agglomeration of nanoparticles was repeated several times. The FESEM for the Ir nanoparticles are shown in Fig. The EDX in FIG. 15 confirms the presence of Ir.

EXAMPLE 6

Figure 14:
FIG. 14 is an FESEM of Ir nanoparticles.
Figure 16:
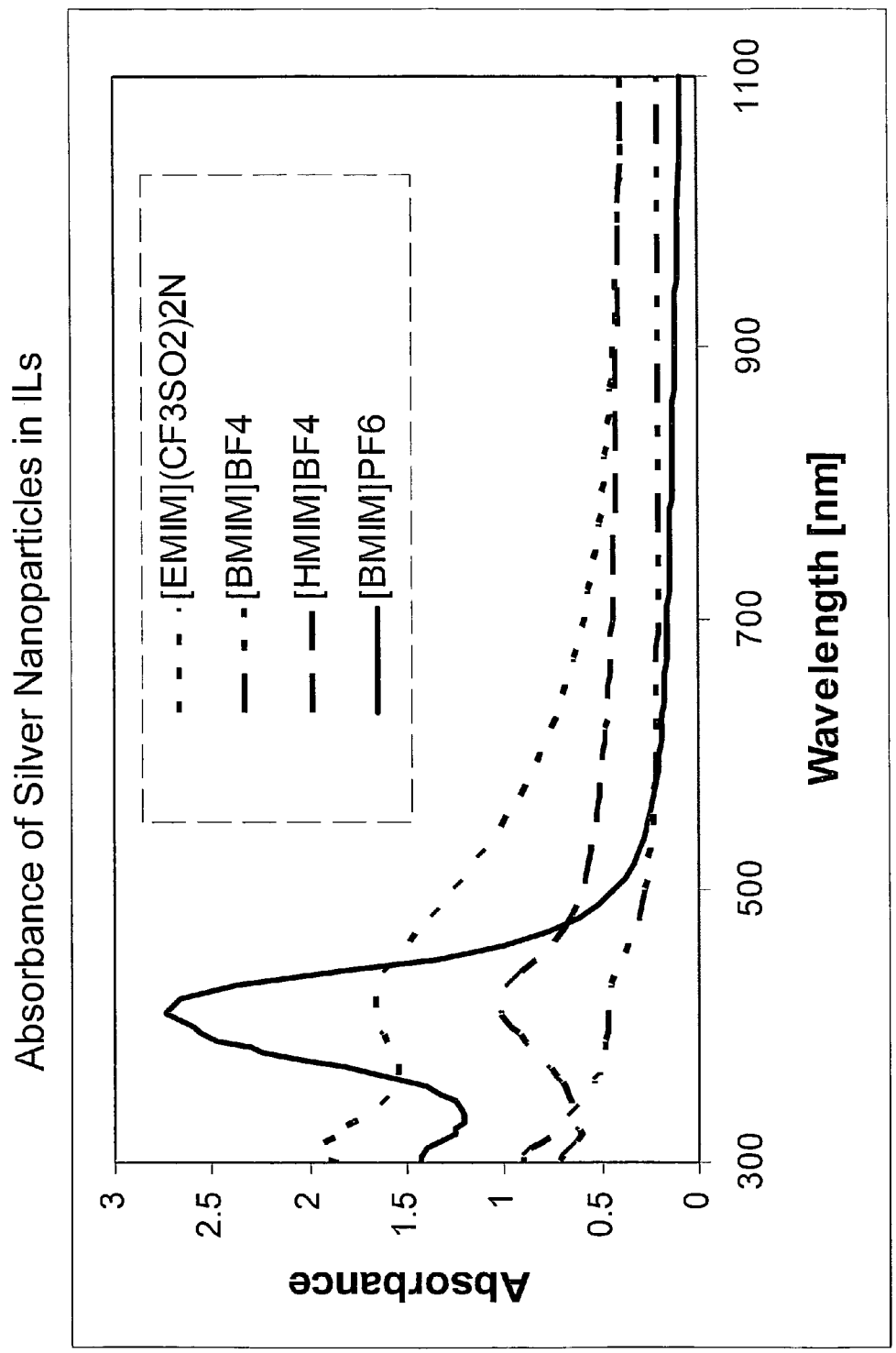
FIG. 16 is a graph of absorbance versus wavelength for Ag nanoparticles in different ionic liquids.

In addition to the materials discussed above, Ti, $TiO_2$, $Zn_2SnO_4$, Si-10 wt % Al oxide, zinc-10 wt % tin oxide, and Ag oxide were magnetron sputter deposited on the IL ([BMIM]$PF_6$). A multilayered coating was also deposited on the IL. The coating comprised the following layers deposited in sequence by magnetron sputtering: $Zn_2SnO_4$/Zn-10 wt % Sn/Ag/Ti/$Zn_2SnO_4$/Zn-10 wt % Sn/Ag/Ti/$Zn_2SnO_4$. Copper and silver were deposited by magnetron sputtering in the manner described herein on the additional ILs consisting of 1-ethyl-3-methylimidazolium trifluoromethane sulfonamide ([EMIM] ($CF_3SO_2)_2$N), 1-butyl-3-methylimidazolium tetrafluoroborate ([BMIM]$BF_4$), and 1-hexyl-3-methylimidazolium tetrafluoroborate ([HMIM]$BF_4$). As shown in FIG. 16, spectrophotometric measurements of these silver containing liquids, measured as described herein, along with the measurement for [BMIM]PF$_6$, showed the strong absorption peak at about 410 nm, which is attributed to the surface plasmon resonance (SPR) absorption for silver nanoparticles in the IL solutions. As will be appreciated from FIG. 14, the particles show texture indicating the agglomeration nanoparticles much smaller than 200 nm, such as no greater than 50 nm, such as no greater than 10 nm.

It is believed that any material(s) that can be deposited by physical vapor deposition (PVD) will result in a stable solution of nanoparticles when deposited in the IL. For example, carbon can be deposited by PVD, e.g., magnetron sputter deposition or carbon arc, on an IL to produce carbon nanoparticles, e.g., carbon nanotubes. Indium tin oxide (ITO) nanoparticles were deposited in [BMIM]PF$_6$ by magnetron sputter deposition. ITO nanoparticles can be used to produce electrically conductive particles that are not absorbing in the visible region of the spectrum. Titanium dioxide nanoparticles were deposited in [BMIM]PF$_6$ by magnetron sputter deposition. Titanium dioxide nanoparticles can be used to produce nano-catalysts.

EXAMPLE 7

As an example of electrochemical deposition of a nanoparticle containing polymer from an nanoparticle containing IL electrolyte produced by the method described herein, a conductive polymer PEDOT (poly 3,4-ethylene dioxythiophene) was grown by electrochemical deposition from an EDOT (3,4-ethylene dioxythiophene) monomer solution in a silver nanoparticle containing [BMIM]PF$_6$ electrolyte solution. The films were grown directly on TEM grids. TEM measurements showed the presence of Ag nanoparticles in the conducting polymer matrix.

This method allows the formation of conducting polymer films with various doping levels from neutral (insulating) to fully doped (conducting) by applying the appropriate voltage during electrodeposition. This hybrid material is of interest in thermoelectric and photovoltaic device applications in addition to electrochromic and organic light emitting device applications.

The method is not limited to the materials described above and can accommodate any electrochemically polymerizable monomer and any type of nanoparticle.

Additional applications for nanoparticle containing ILs include biocides, batteries, pigments, lubricants, and cosmetics. Substrates such as membranes, filters, fabrics, and nanopore ceramics can be imbibed with the nanoparticle containing IL and depending on the application, type of substrate, or pretreatment of the substrate, the substrate can be rinsed of the IL leaving a nanoparticles distributed within the pores of the substrate. The substrate can be flexible or rigid or transparent or opaque. One particularly suitable membrane is a Teslin® membrane, manufactured by PPG Industries, Inc.

Effects on Particle Properties

Since the substrate for these experiments was moving, a broader size distribution of particles was collected in the IL as illustrated in the FESEM images. The form of material that is deposited, in particular the size and shape of the particles, are determined by the deposition parameters such as power applied to the target, or substrate speed (including depositing on a stationary substrate) and substrate-target distance, gas and vacuum chamber pressure. The angle between the source and the substrate, which is not taken into account when the substrate is moving, strongly determines the size and shape of the particles. Selecting a stationary substrate in direct line with the source, and shielding the low angle incident particles will give a more uniform distribution of particles. Alternatively, collecting particles from the source on the substrate as a function of distance and/or angle from the source will result in a distribution of particle size. Additionally, it has been shown that the particle volume is proportional to the pressure, thus illustrating the importance of having a liquid that is compatible with both the vacuum system and the particles. Properties of the IL, such as viscosity, temperature, thickness, chemical composition will affect the particle's properties. Sputtering, in particular, is an atomic deposition process where size can be controlled precisely. Alloy targets or co-sputtered targets, and gas composition can be changed or mixed to deposit materials, such oxynitrides from argon-oxygen-nitrogen gas mixtures. However, other methods such as thermal or electron beam evaporation, or cathodic arc deposition can be controlled to produce particles at high deposition rates over a wide range of sizes, from nanoparticles to hundreds of micrometers. As will be appreciated from the above discussions, the IL need not include a surfactant to prevent agglomeration of the particles.

Reactions of the Particle Containing Liquid

The nanoparticle containing IL can be combined with other materials to impart additional characteristics in the resulting combination. In general, several types of polymerization using ILs are described in the art including homopolymerization, statistical copolymerization, block copolymerization and polymer-ionic liquid composites. These types of polymerization could be carried out using ILs containing nanoparticles made by the method of the invention to avoid multiple processing steps as described in the art.

For example, exposed ILs containing copper, silver, or silver oxide were combined with a cyanoacrylate ester (Permabond 910FS adhesive) to form a plastic substance. As another example, the silver containing IL was combined with urethane oligomer/methacrylate monomer blend (Kemkert Kao Optical Adhesive 300) which cures in the UV range 320-380 nm. The mixture was sandwiched between two pieces of clear float glass and then UV cured to produce a glass/polymer (consisting of the cured mixture)/glass laminate. In another example, Elvacite acrylic resin was dissolved in Dowanol PM (glycol ether PM) and [BMIM]BF$_4$ and [BMIM]PF$_6$ containing nanoparticles were added to the solution. The [BMIM]BF$_4$ containing Ir nanoparticle formed a gel and was heated to 132° C. to form a plastic substance. The plastic substance was rinsed in acetone to remove residue. The plastic substance retained the brownish color of the original IL containing solution, indicating the presence of the Ir nanoparticles. The [BMIM]BF$_6$ containing ZnO and [BMIM]BF$_6$ containing ITO nanoparticles made by the method described herein were added to the same solution and heated 12 hours at 132° C. to form a plastic substance, indicating that nanoparticles can be incorporated into a plastic substrate.

As will be appreciated from the above discussion, ILs with either particles dispersed therein, or films formed thereon, or both, can be further processed into a variety of products. For example, additives or reactants can be added to the ILs to form solids, e.g., plastics, incorporating the particles or films. Or, the ILs can be used as a solvent for further processing or reaction.

Apparatus for Deposition into a Liquid

An apparatus for the deposition into an IL consists of a vessel that acts as a reservoir for the IL. The vessel is located in a position to capture material as it is deposited by a physical vapor deposition process. The vessel can contain inlet and outlet ports for the transport of the IL into the vessel and/or extraction of the particle containing IL from the vessel. The vessel can contain any conventional device to cool or heat the IL. The port enables extraction in a controlled environment, e.g., vacuum or inert atmosphere. The extraction enables transport of the liqnoyl for further processing.

Other means for containing a liquid described in the art can be used with the IL. These include the conventional VEROS technique or modifications thereof, or the conventional VERL technique or modifications thereof, for example as described in S. Yatsuya, Y. Tsukasaki, K. Mihama and R. Uyeda, *J. Cryst. Growth,* 43, 490 (1978) and I. Nakatani, T. Furubayashi, *J. Magn. Magn. Mater.,* 122 (1993) 10, respectively.

It will be readily appreciated by those skilled in the art that modifications may be made to the invention without departing from the concepts disclosed in the foregoing description. Such modifications are to be considered as included within the scope of the invention. Accordingly, the particular embodiments described in detail hereinabove are illustrative only and are not limiting as to the scope of the invention, which is to be given the full breadth of the appended claims and any and all equivalents thereof.

What is claimed is:

1. A method for producing particles, comprising the sequential steps of:
   spreading an ionic liquid over a surface of a substrate, thereby forming an ionic liquid coated substrate,
   introducing said ionic liquid coated substrate into a deposition chamber; and
   moving said ionic liquid coated substrate under a physical vapor deposition target, thereby directing one or more materials onto the ionic liquid of the ionic liquid coated substrate by physical vapor deposition, and providing particles in the ionic liquid of the ionic liquid coated substrate.

2. The method of claim 1, further including evacuating the deposition chamber.

3. The method of claim 2, wherein the deposition chamber is evacuated to provide a vacuum of no greater than 10 microns of Hg.

4. The method of claim 2, wherein the deposition chamber is evacuated to provide a vacuum of no greater than 7 microns of Hg.

5. The method of claim 1, wherein the particles have a diameter no greater than 500 nm.

6. The method of claim 1, wherein the particles have a diameter no greater than 200 nm.

7. The method of claim 1, wherein the particles have a diameter in the range of 1 nm to 200 nm.

8. The method of claim 1, wherein the ionic liquid comprises at least one cation selected from mono-, di-, and trisubstituted imidazoliums; substituted pyridiniums; substituted pyrrolidiniums; tetraalkyl phosphoniums; tetraalkyl ammoniums; guanidiniums; isouroniums; and thiouroniums.

9. The method of claim 1, wherein the ionic liquid comprises at least one anion selected from chlorides; bromides; iodides; tetrafluoroborates; hexafluorophosphates; bis(trifluoromethylsulfonyl)imides; tris(pentafluoroethyl)trifluorophosphates (FAPs); trifluoromethanesulfonates; trifluoroacetates; methylsulfates; octylsulfates; thiocyanates; organoborates; and p-toluenesulfonates.

10. The method of claim 1, wherein the ionic liquid is selected from 1-butyl-3-methylimidazolium hexafluorophosphate ([BMIM]$PF_6$), 1-hexyl-3-methylimidazolium tetrafluoroborate ([HMIM]$BF_4$), 1-butyl-3-methylimidazolium tetrafluoroborate ([BMIM]$BF_4$), and 1-ethyl-3-methylimidazolium trifluoromethane sulfonamide ([EMIM]($CF_3SO_2$)$_2$N).

11. The method of claim 1, wherein the ionic liquid has a viscosity no greater than 1110 cP at a temperature of 23° C.

12. The method of claim 1, wherein the depositing step is conducted by magnetron sputtering or electron beam evaporation.

13. The method of claim 12, wherein the sputtering is conducted in a reactive atmosphere.

14. The method of claim 12, wherein the sputtering is conducted in an evacuated atmosphere.

15. The method of claim 12, wherein the sputtering is conducted in an inert atmosphere.

16. The method of claim 1, wherein the ionic liquid comprises a mixture of two or more ionic liquids.

17. The method of claim 1, including adjusting the viscosity of the ionic liquid.

18. The method of claim 17, wherein the adjusting step is performed by adding one or more polymers or monomers to the ionic liquid.

19. The method of claim 1, including adding one or more monomers or polymers to the ionic liquid.

20. The method of claim 19, including reacting the monomers or polymers to form a polymeric material containing the particles.

21. The method of claim 1, wherein said ionic liquid comprises at least one cation selected from the group consisting of, substituted pyridiniums; substituted pyrrolidiniums; tetraalkyl phosphoniums; tetraalkyl ammoniums; guanidiniums; isouroniums; and thiouroniums.

22. The method of claim 1, further comprising moving said ionic liquid coated substrate more than one time under said physical vapor deposition target.

23. The method of claim 1, further comprising depositing a multilayered coating by physical vapor deposition onto the ionic liquid of the ionic liquid coated substrate.

24. A method for producing particles, comprising:
   introducing an ionic liquid into a deposition chamber; and
   directing one or more materials onto the ionic liquid by physical vapor deposition to provide particles in the ionic liquid,
   wherein said method further comprises adding one or more monomers to the ionic liquid.

25. The method of claim 24, further comprising reacting the monomers to form a polymeric material containing the particles.

* * * * *